(12) United States Patent
Izumi

(10) Patent No.: US 8,206,525 B2
(45) Date of Patent: Jun. 26, 2012

(54) WAFER BONDING APPARATUS

(75) Inventor: Shigeto Izumi, Yokohama (JP)

(73) Assignee: Nikon Corporation, Tokyo (JP)

( * ) Notice: Subject to any disclaimer, the term of this patent is extended or adjusted under 35 U.S.C. 154(b) by 618 days.

(21) Appl. No.: 12/306,445

(22) PCT Filed: Jun. 15, 2007

(86) PCT No.: PCT/JP2007/062106
§ 371 (c)(1),
(2), (4) Date: Feb. 9, 2009

(87) PCT Pub. No.: WO2008/001626
PCT Pub. Date: Jan. 3, 2008

(65) Prior Publication Data
US 2009/0317960 A1    Dec. 24, 2009

(30) Foreign Application Priority Data
Jun. 29, 2006   (JP) .............................. 2006-180288

(51) Int. Cl.
*B32B 37/00* (2006.01)
(52) U.S. Cl. .......... 156/64; 156/228; 156/358; 156/359; 156/583.1
(58) Field of Classification Search ............ 156/64, 156/228, 358, 359, 580, 581, 583.1
See application file for complete search history.

(56) References Cited

U.S. PATENT DOCUMENTS

| | | | |
|---|---|---|---|
| 6,451,670 B1 * | 9/2002 | Takisawa et al. ............ 438/457 |
| 6,706,618 B2 * | 3/2004 | Takisawa et al. ............ 438/457 |
| 2002/0034859 A1 | 3/2002 | Takisawa et al. |
| 2002/0182038 A1 | 12/2002 | Takisawa et al. |

FOREIGN PATENT DOCUMENTS

| | | |
|---|---|---|
| EP | 0 899 778 A2 | 3/1999 |
| JP | 03-136343 | 6/1991 |
| JP | 07-086336 | 3/1995 |
| JP | 07-201690 | 8/1995 |
| JP | 08-097110 | 4/1996 |
| JP | 11-074164 | 3/1999 |
| JP | 2004-063947 | 2/2004 |
| JP | 2005-235818 | 9/2005 |
| JP | 2005-302858 | 10/2005 |

OTHER PUBLICATIONS

European Search Report dated Aug. 20, 2010.

* cited by examiner

*Primary Examiner* — James Sells
(74) *Attorney, Agent, or Firm* — Finnegan, Henderson, Farabow, Garrett & Dunner, L.L.P.

(57) ABSTRACT

Provided is a wafer bonding apparatus which performs pressurization and heating and eliminates nonuniformity of wafer thickness by changing the shape of a pressurizing surface so that planarity of a wafer bonding surface is improved. The wafer bonding apparatus places a plurality of wafers to be bonded between an upper unit (101U) and a lower unit (101L), and bonds the wafers by applying pressure and heat by the upper unit and the lower unit. The wafer bonding apparatus is provided with a top plate (111), a pressure profile control module (131), and a heater section arranged between the top plate and the pressure profile control module for heating. Shape change generated on the surface of the pressure profile control module causes change of the surface of the top plate.

13 Claims, 19 Drawing Sheets

(A) F1>F2

(B) F1=F2

(C) F1<F2

(A)

(B)

WAFER BONDING APPARATUS

TECHNICAL FIELD

The present invention relates to a wafer bonding apparatus, in which plural wafers are placed such that one is put on another to bond electrodes, thereby producing a semiconductor integrated circuit. Particularly the invention relates to an apparatus, which bonds plural wafers while heating and pressurizing the wafers.

BACKGROUND ART

Recently a notebook personal computer, a portable telephone, and the like in which a semiconductor integrated circuit is used have a sophisticated function more and more. As a result, there is an increased need for higher density and higher functionality of the semiconductor integrated circuit.

One of the method for realizing the high density and high functionality of the semiconductor integrated circuit is to laminate the wafer. In order to laminate the wafer, it is necessary that, after bonding electrodes are formed in wafer surfaces in which the circuit is already formed, the electrodes of two wafers or an already laminated wafer and wafer to be laminated next be brought into contact with and bonded to each other. In cases where wafer electrodes are bonded to each other, it is important to evenly bring the electrodes into contact with each other and to activate the electrode bonding surfaces. In order to evenly bring the electrodes into contact with each other, it is necessary to improve flatness of the bonding interface. The wafers are, for example, heated to activate the electrode bonding surfaces.

Therefore, there is developed an apparatus, which bonds the wafers while pressurizing and heating the wafers (for example, see Japanese Patent Application Laid-Open No. 2005-302858).

FIG. 15 is a view showing cross sections of two wafers 201U and 201L to be bonded. Irregularities of 3 to 5 micrometers exist in the surface of the wafer (FIG. 15A). The irregularities are caused by a variation in wafer thickness. Pressures are applied to the two laminated wafers 201U and 201L from both sides to improve the flatness of the wafer bonding interface. In this case, when the wafer bonding interface becomes flat, a variation in wafer thickness emerges in an opposite surface to the wafer bonding interface (FIG. 15B). Accordingly, in order to eliminate an influence of the variation in wafer thickness on the flatness of the wafer bonding interface, it is necessary that the variation in wafer thickness be absorbed while pressurizing and heating are performed.

In order to improve the flatness of the wafer bonding interface, it is necessary to change a shape of a pressurizing surface.

However, conventionally there has not been developed a wafer bonding apparatus in which a shape of a pressurizing surface is changed to absorb the variation in wafer thickness while the pressurizing and heating are performed in order to improve the flatness of the wafer bonding interface.

DISCLOSURE OF THE INVENTION

There is a need for the wafer bonding apparatus in which a shape of the pressurizing surface is changed to absorb a variation in wafer thickness while pressurizing and heating are performed in order to improve a flatness of the wafer bonding interface.

In accordance with an aspect of the invention, a wafer bonding apparatus of the invention in which a plurality of wafers to be bonded are disposed between an upper unit and a lower unit and the wafers are bonded while pressurized and heated by the upper unit and the lower unit, the wafer bonding apparatus of the invention includes a top plate; a pressure profile control module; and a heater unit for heating which is disposed between the top plate and the pressure profile control module, wherein a change in shape generated in a surface of the pressure profile control module is brought to a surface of the top plate.

Accordingly, in the wafer bonding apparatus, of the invention the surface shape of the top plate which is of the pressurizing surface can be changed by changing the surface shape of the pressure profile control module, so that the flatness of the wafer bonding interface can be improved.

In the wafer bonding apparatus according to an embodiment of the invention, a hollow portion is provided in the pressure profile control module such that a pressure in the hollow portion can be controlled, and a variation in wafer thickness is absorbed to improve flatness of a bonding interface.

Accordingly, in the wafer bonding apparatus according to the embodiment, the pressure profile control module is deformed by controlling a pressure in the hollow portion of the pressure profile control module, such that a variation in wafer thickness can be absorbed to improve the flatness of the bonding interface.

In the wafer bonding apparatus according to another embodiment of the invention, the heater unit includes plural heating modules.

The heater unit includes plural heating modules, such that a deformation of the pressure profile control module can truly be transmitted to the top plate. A deformation of the top plate, caused by a variation in wafer thickness, is truly transmitted to the pressure profile control module. Therefore, the pressure profile control module can securely absorb the variation in wafer thickness.

Accordingly, the invention can provide the wafer bonding apparatus in which a shape of the pressurizing surface is changed to absorb a variation in wafer thickness such that the flatness of the wafer bonding interface may be improved while pressurizing and heating are performed.

BEST MODE FOR CARRYING OUT THE INVENTION

Figure 1:
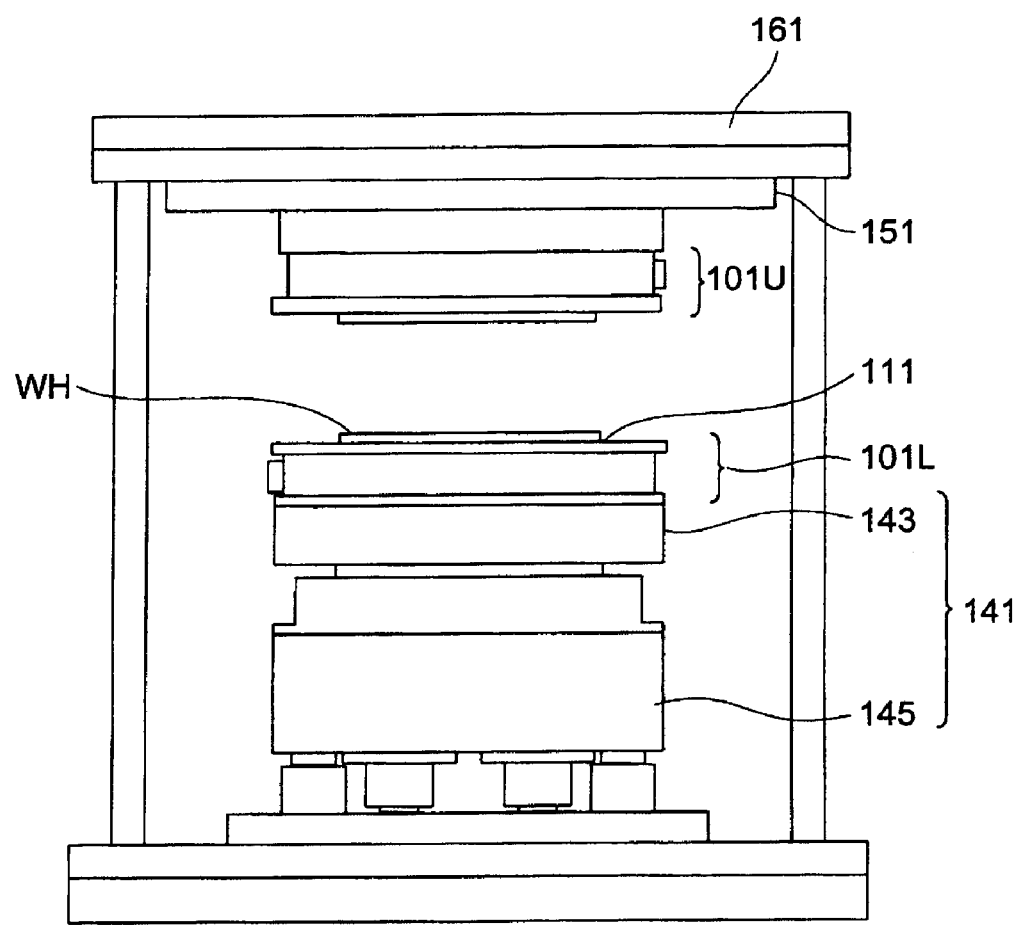
FIG. 1 is a view showing an entire configuration of a wafer bonding apparatus according to an embodiment of the invention.

FIG. 1 is a view showing an entire configuration of a wafer bonding apparatus according to an embodiment of the invention.

The wafer bonding apparatus includes a pressurizing unit 141 and a base 151, which are attached to a vacuum chamber 161 while accommodated in the vacuum chamber 161. The pressurizing unit 141 includes a base 145 of the pressurizing unit and a lifting unit 143 of the pressurizing unit. A lower heater unit 101L is attached to the lifting unit 143 of the pressurizing unit. An upper heater unit 101U is attached to the base 151.

A wafer held by a wafer holder WH is disposed between the upper heater unit 101U and the lower heater unit 101L, and the wafer is pressurized and heated between the upper heater unit 101U and the lower heater unit 101L by lifting the lifting unit 143 of the pressurizing unit.

Figure 2A:
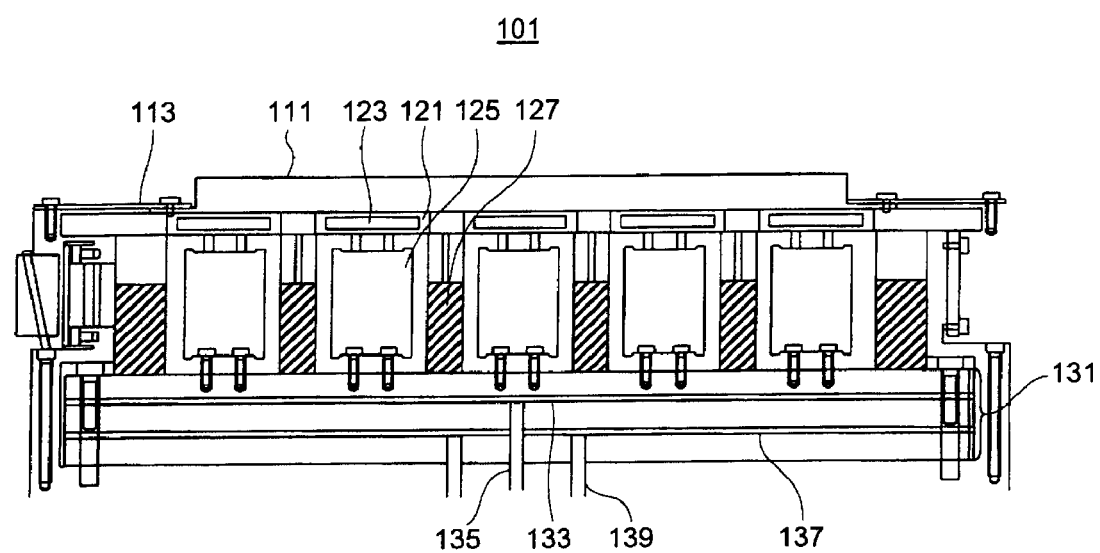
FIG. 2A is a view showing a configuration of a heater unit.

FIG. 2A is a view showing configurations of the upper heater unit 101U and lower heater unit 101L. Hereinafter the upper and lower heater units are simply referred to as heater unit 101.

The heater unit 101 includes a top plate 111, a top plate base 113, plural heating modules 121, a heating module support member 125, a heat insulating member 127, and a pressure profile control module 131. A hollow portion 133 is provided in the pressure profile control module 131, air piping 135 is connected to the hollow portion 133, and an internal pressure of the hollow portion 133 is configured as to be controlled by an electro-pneumatic regulator (not shown). A cooling unit 137 and cooling piping 139 are provided in the pressure profile control module 131.

For example, the top plate 111 has a diameter of 220 millimeters and a thickness of 10 millimeters, and is made of a silicon carbide.

For example, the top plate base 113 has a diameter of 320 millimeters and a thickness of 1 millimeter, and is made of a silicon carbide.

A heat insulating ring (not shown) made of ceramic having low thermal conductivity may be provided between a circumferential portion of the top plate 111 and the top plate base 113.

The pressure profile control module 131 is configured by three plates, that is, an upper plate, an intermediate plate, and a lower plate. For example, each of the three plates has a diameter of 225 millimeters and a thickness of 10 millimeters, and is made of a silicon carbide. For example, the hollow portion 133 has a thickness of 2 millimeters.

Figure 2B:
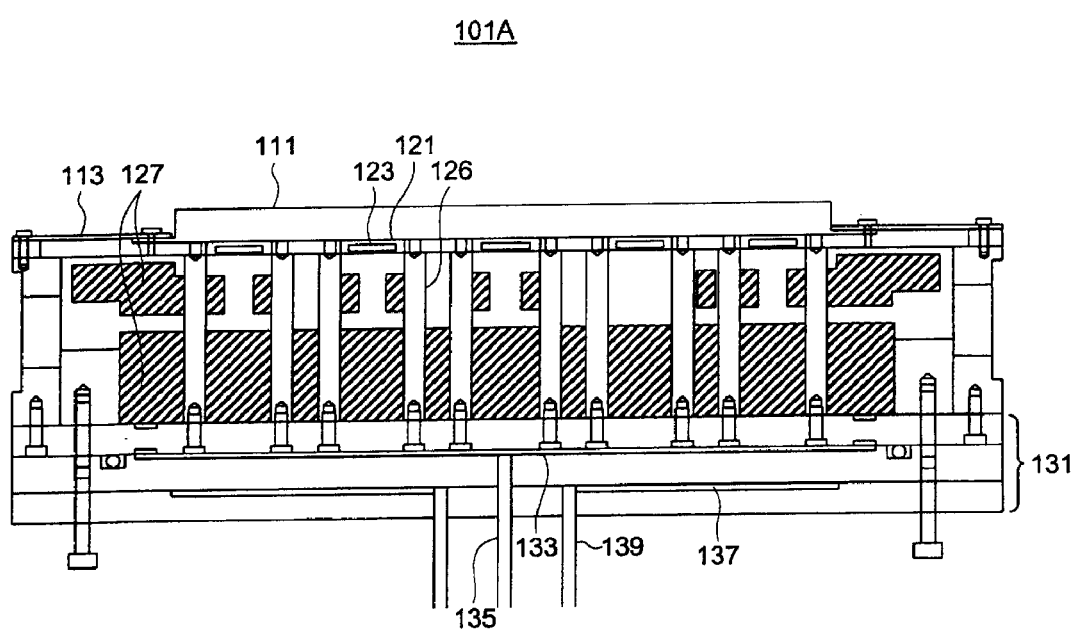
FIG. 2B is a view showing a configuration of a variation of the heater unit.

FIG. 2B is a view showing a configuration of a modification 101A of the heater unit.

The heater unit 101A includes the top plate 111, the top plate base 113, the plural heating modules 121, a top plate support member 126, the heat insulating member 127, and the pressure profile control module 131. In the modification, the top plate support member 126 fixed to the pressure profile control module 131 supports the top plate 111. The top plate support member 126 pierces an opening provided in the heating module 121.

The configurations of the top plate 111, top plate base 113, and pressure profile control module 131 of the heater unit 101A are similar to corresponding portions of the heater unit 101.

The heater unit 101 shown in FIG. 2A will be described below.

Figure 3:
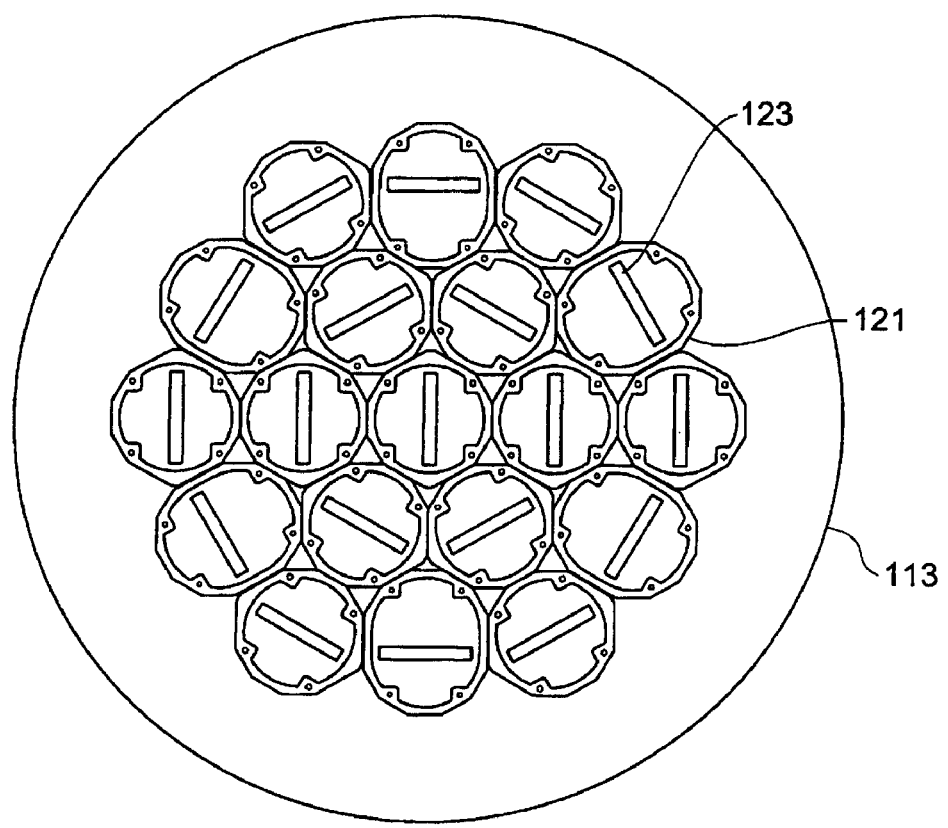
FIG. 3 is a view showing an arrangement of plural heating modules.

FIG. 3 is a view showing a planar arrangement of plural heating modules 121. In the embodiment, one heating module is disposed at a position (central portion) corresponding to the center of the top plate 111, six heating modules are disposed in surroundings (intermediate portion) of the central portion, and 12 heating modules are disposed in surroundings (circumferential portion) of the intermediate portion.

The heater unit is divided into plural heating modules, so that a deformation of the top plate 111 caused by a variation in wafer thickness can be easily absorbed. As described later, temperature control can separately be performed to the plural heating modules. Additionally, as described later, a surface shape of the top plate 111 can be easily controlled.

Thus, preferably the heater unit is divided into plural heating modules. Alternatively, an integrated type heater may be used when the heater unit is easily deformed by thinning the thickness thereof.

Figure 4:
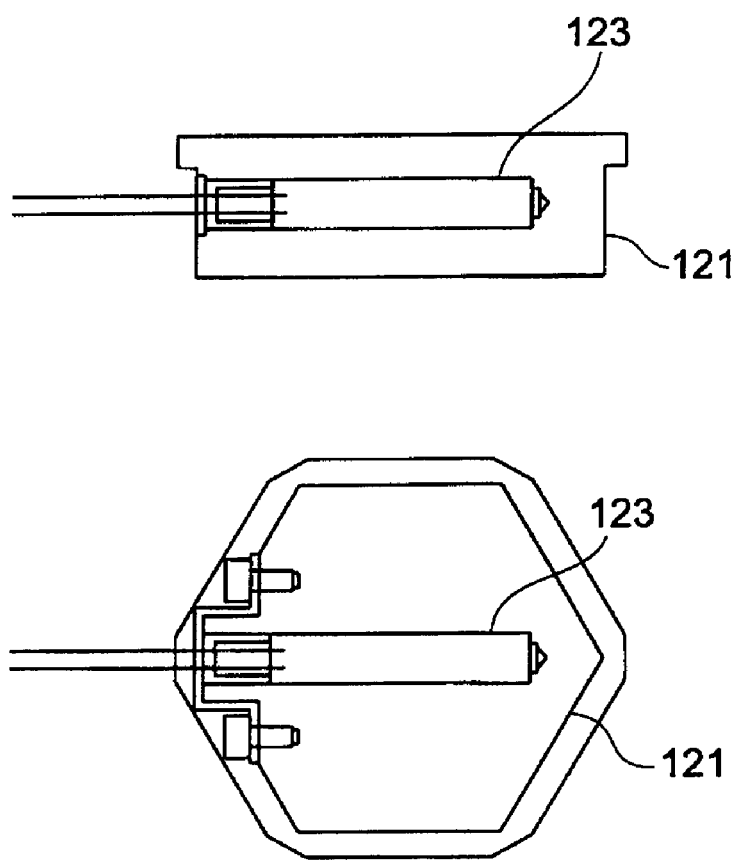
FIG. 4 is a view showing a configuration of a heating module.

FIG. 4 is a view showing a configuration of the heating module 121. For example, the heating module 121 may be formed into a hexagonal shape. For example, the heating module has the thickness of 10 millimeters.

The heating module includes an electric heater 123. In the top plate 111, a thermometer such as a thermocouple or a resistance thermometer sensor may be placed at a position corresponding to the heating module 121, and the temperature control may be performed by manipulating an output of the electric heater 123.

In the temperature control with the electric heater 123, feedback control may be performed by a phase control system with a measured value of the thermometer as a controlled variable. The temperature control may be performed in each heating module. The heating modules are grouped in each of the central portion (one heating module), the intermediate portion (six heating modules), and the circumferential portion (12 heating modules), and the temperature control may be performed in each group.

Figure 16:
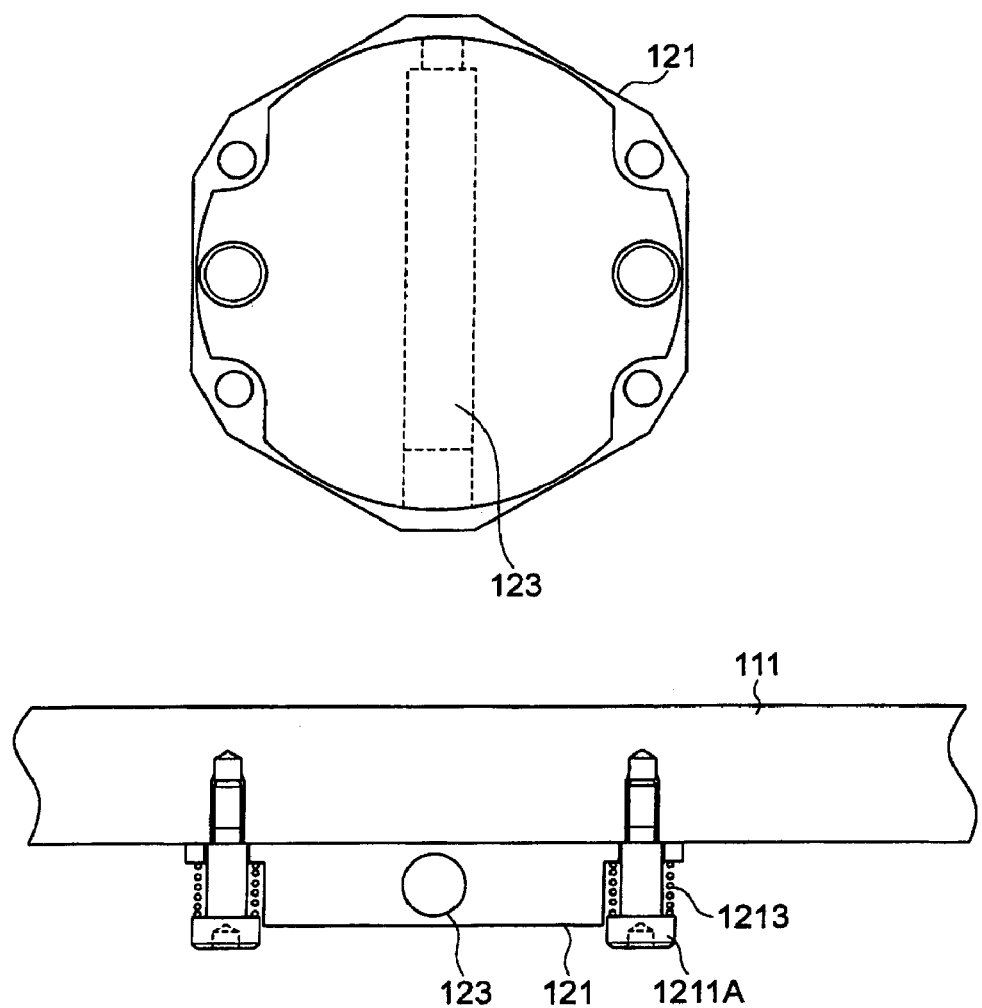
FIG. 16 is a view showing the heating module and the heating module attached to the top plate.

FIG. 16 is a view showing the heating module 121 and the heating module 121 attached to the top plate 111. The heating module 121 is attached to an opposite surface to a surface facing the wafer of the top plate 111 using reamer bolts 1211A and heat-resistant springs 1213.

Figure 17:
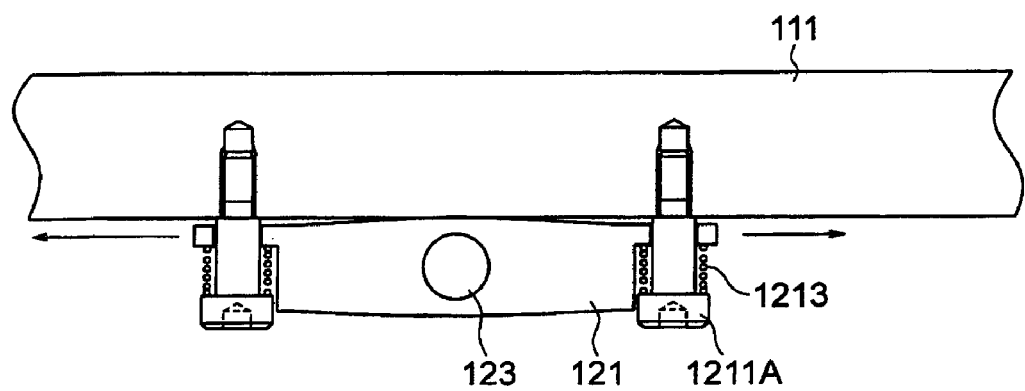
FIG. 17 is a view showing a thermal deformation of the heating module which is attached to the top plate surface using reamer bolts and heat-resistant springs.

FIG. 17 is a view showing a thermal deformation of the heating module 121 which is attached to the surface of the top plate 111 using reamer bolts 1211A and heat-resistant springs 1213. Because a temperature becomes the highest near the electric heater 123, a thermal expansion becomes the maximum around the electric heater 123 of the heating module 121. Accordingly, the curvature is generated in the surface facing the top plate 111 of the heating module 121. In the embodiment, the heat-resistant spring 1213 is compressed by the thermal deformation of the heating module 121, which results in a gap between the heating module 121 and the top plate 111 as shown in FIG. 17. A tension caused by a difference in thermal expansion coefficient between the heating module 121 and the top plate 111 is not generated because a slip is generated between the heating module 121 and the top plate 111. Therefore, the top plate is not deformed. At this point, for example, the heating module 121 is made of copper (Cu), and the top plate 111 is made of a silicon carbide (SiC).

Figure 18:
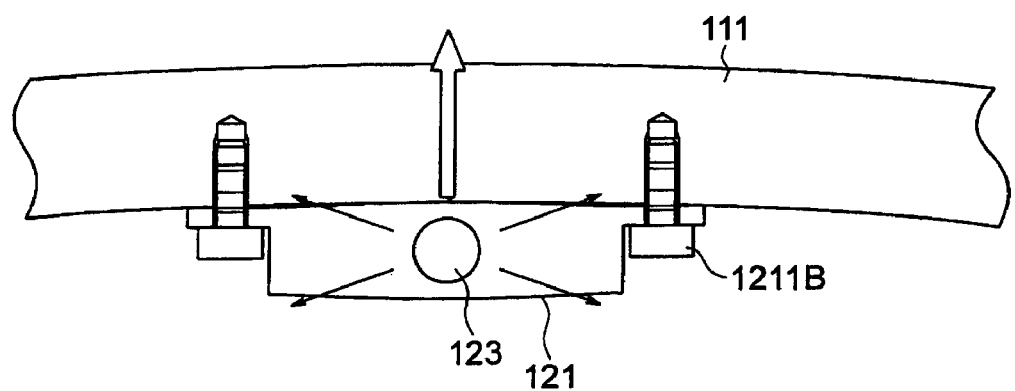
FIG. 18 is a view showing a thermal deformation of the heating module which is attached to the top plate surface using screws alone.

FIG. 18 is a view showing a thermal deformation of the heating module 121 which is attached to the surface of the top plate 111 only using screws 1211B. The surface facing the top plate 111 of the heating module 121 is curved, and a stress is generated in a direction indicated by an arrow in the top plate 111. As a result, unfortunately the top plate 111 is also deformed.

Figure 5:
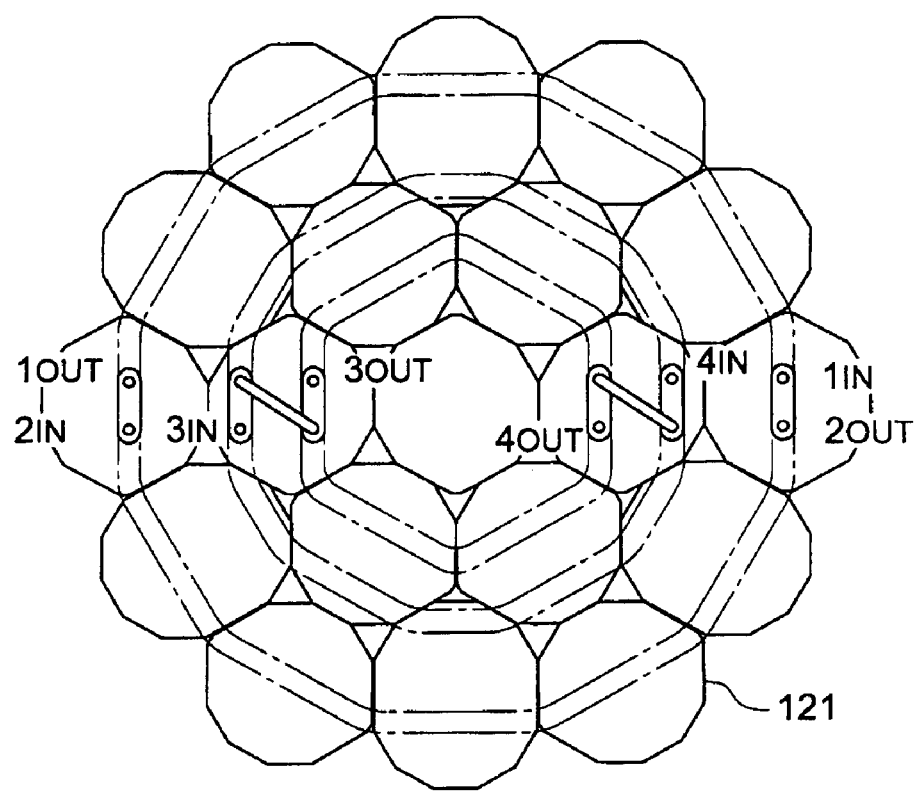
FIG. 5 is a view showing a configuration of cooling piping of the heating module.

FIG. 5 is a view showing a configuration of cooling piping of the heating module. It is necessary to repeatedly perform the heating and cooling in repeatedly performing the wafer bonding, and it is necessary to efficiently perform the cooling in order to improve the throughput. The cooling piping is disposed so as to pierce the heating module 121. In the embodiment, cooling is the water cooling, and the cooling piping includes four systems. An inlet (IN) and an outlet (OUT) of each system are designated by numerals (1 to 4).

Figure 6:
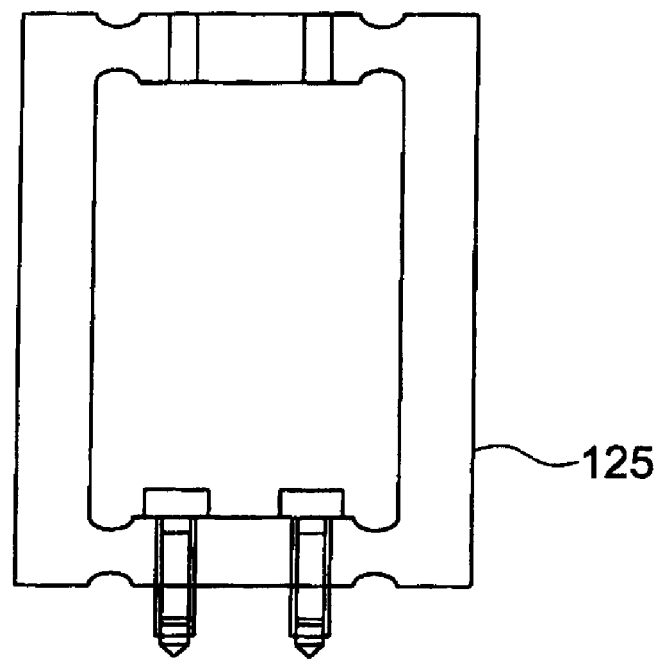
FIG. 6 is a view showing a shape of a heating module support member.

FIG. 6 is a view showing a shape of the heating module support member 125. The heating module support member 125 is provided in each heating module 121. Thus, because the heating module support member 125 is provided in each heating module 121, a deformation of the top plate 111, caused by a variation in wafer thickness, is easily transmitted to the pressure profile control module 131.

The heating module support member 125 is formed into a frame shape, that is, a hollow square shape. The reason why the heating module support member 125 is formed into the frame shape is that a sectional area is reduced to minimize a heat quantity moved from the heating module 121 to the pressure profile control module 131 as much as possible. Preferably the material of the heating module support member 125 is ceramics, particularly low-thermal expansion ceramics (cordierite ceramics) having low thermal conductivity. Preferably a neck is provided in the heating module support member 125 so as to be easily deformed.

Figure 7:
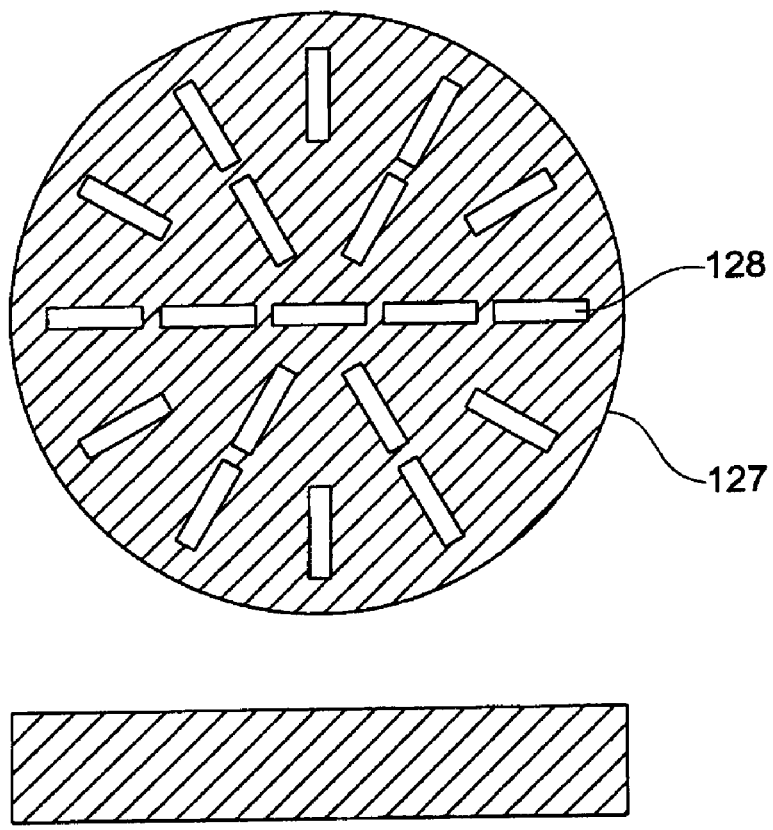
FIG. 7 is a view showing a shape of a heat insulating member.

FIG. 7 is a view showing a shape of the heat insulating member 127. The heat insulating member 127 includes an opening 128 for the heating module support member 125. The heat insulating member reduces the thermal quantity moved from the heating module 121 to the pressure profile control module 131 as much as possible.

Figure 8:
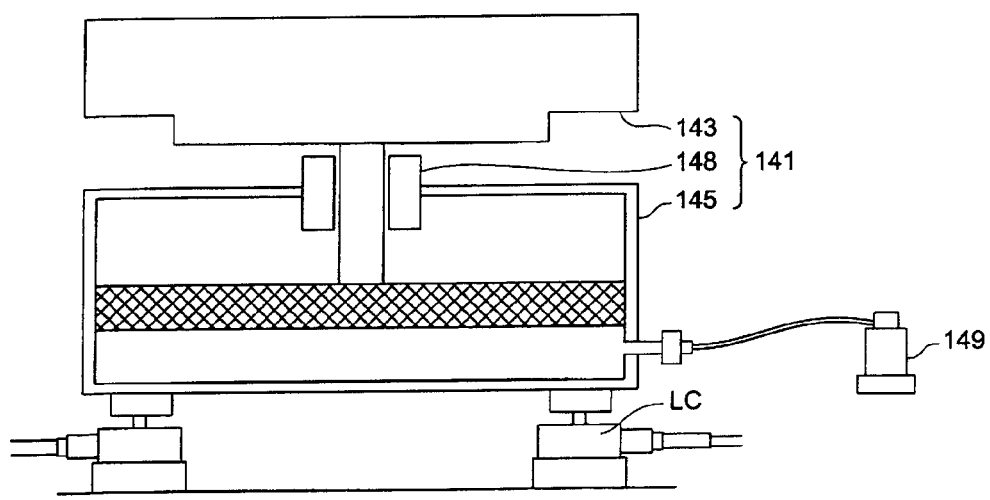
FIG. 8 is a view showing a configuration of a pressurizing unit.

FIG. 8 is a view showing a configuration of the pressurizing unit 141. As described above, the pressurizing unit 141 includes the base 145 of the pressurizing unit and the lifting unit 143 of the pressurizing unit. An internal pressure of the base 145 of the pressurizing unit is increased to lift and lower the lifting unit 143 of the pressurizing unit. An electro-pneumatic regulator 149 may be used to control the internal pressure of the base 145 of the pressurizing unit. The lifting unit 143 of the pressurizing unit is configured to be lifted and lowered along a stroke guide 148.

A pressure sensor such as a load cell LC is placed so as to support the base 145 of the pressurizing unit, and the electro-pneumatic regulator may be manipulated by feedback control with pressure detection value as a controlled variable during pressurizing. A position detection sensor such as a linear scale is placed in the lifting unit 143 of the pressurizing unit, and another electro-pneumatic regulator may be manipulated in lowering and lifting the lifting unit 143 of the pressurizing unit such that a lifting speed becomes a target value based on the position detection value.

An operation of the wafer bonding apparatus of the embodiment will be described below.

The plural wafers to be bonded are aligned with each other while held by the wafer holder. Hereinafter the wafers to be bonded are referred to as workpiece.

Figure 14:
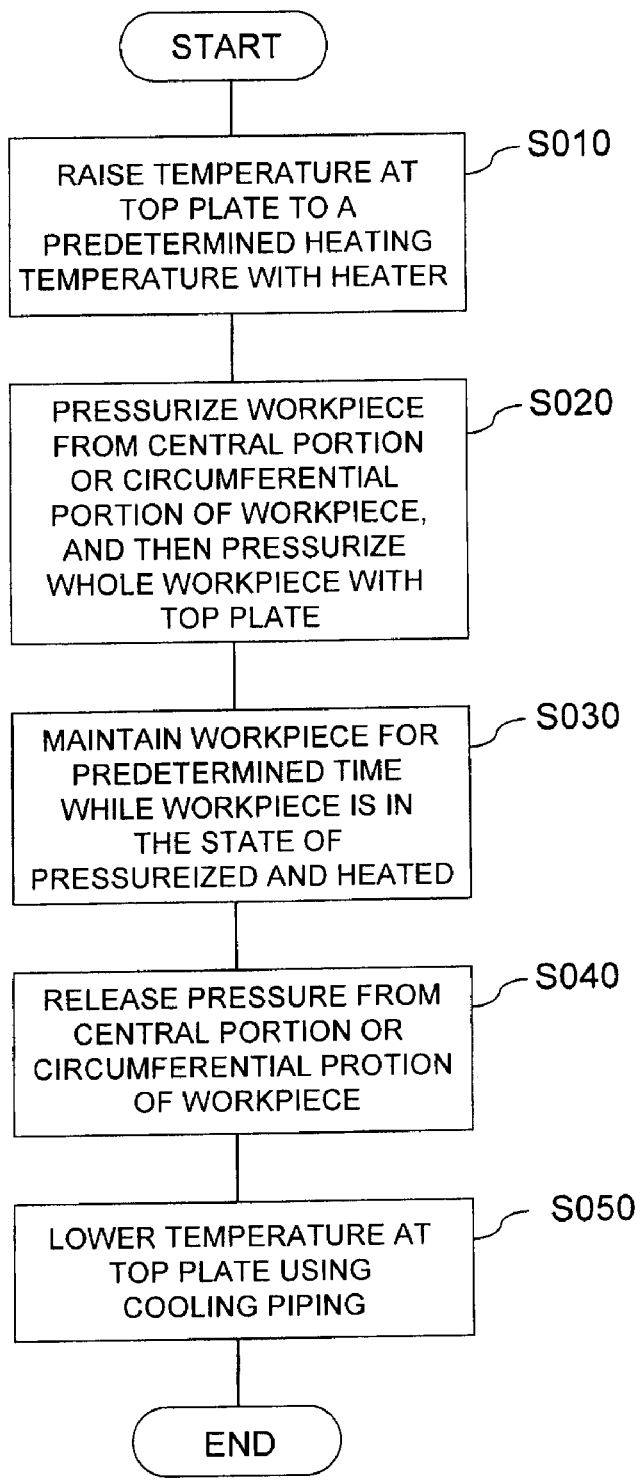
FIG. 14 is a flowchart showing an example of a method for pressurizing and heating a workpiece.
Figure 15:
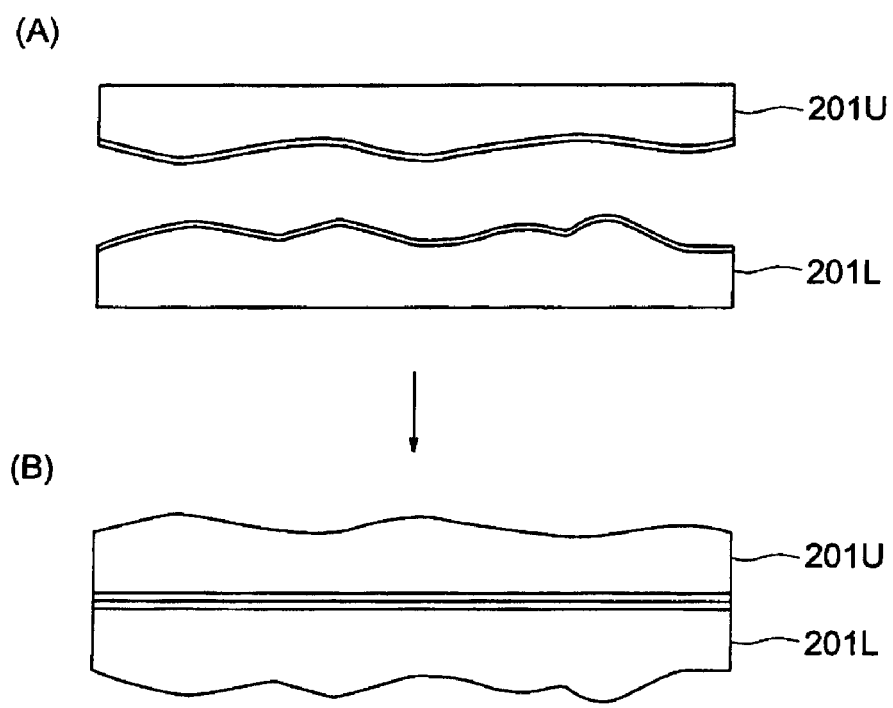
FIG. 15 is a view showing two cross sections of wafers to be bonded.

FIG. 14 is a flowchart showing an example of a method for pressurizing and heating the workpiece.

In Step S010, the heater 123 increases a temperature of the top plate 111 to a predetermined temperature, for example, 400° C.

In Step S020, the central portion or circumferential portion of the workpiece is initially pressurized by the top plate 111, and then the whole workpiece is pressurized. The top plate has a surface pressure of, for example, 400 kPs at the maximum.

In Step S030, the workpiece is maintained for a predetermined time in the state of pressurized and heated. The temperature control is performed using temperatures of the thermometers placed in the top plate such that the whole workpiece is maintained at an even temperature. Specifically, temperatures are separately controlled at the heating module of the central portion, the heating module of the intermediate portion, and the heating module of the circumferential portion.

In Step S040, the pressure is released from the central portion or circumferential portion of the workpiece.

In Step S050, the temperatures at the top plate are lowered by the cooling piping.

The method for pressurizing the central portion or circumferential portion of the workpiece in Steps S020 and S030 will be described in detail.

Figure 9:
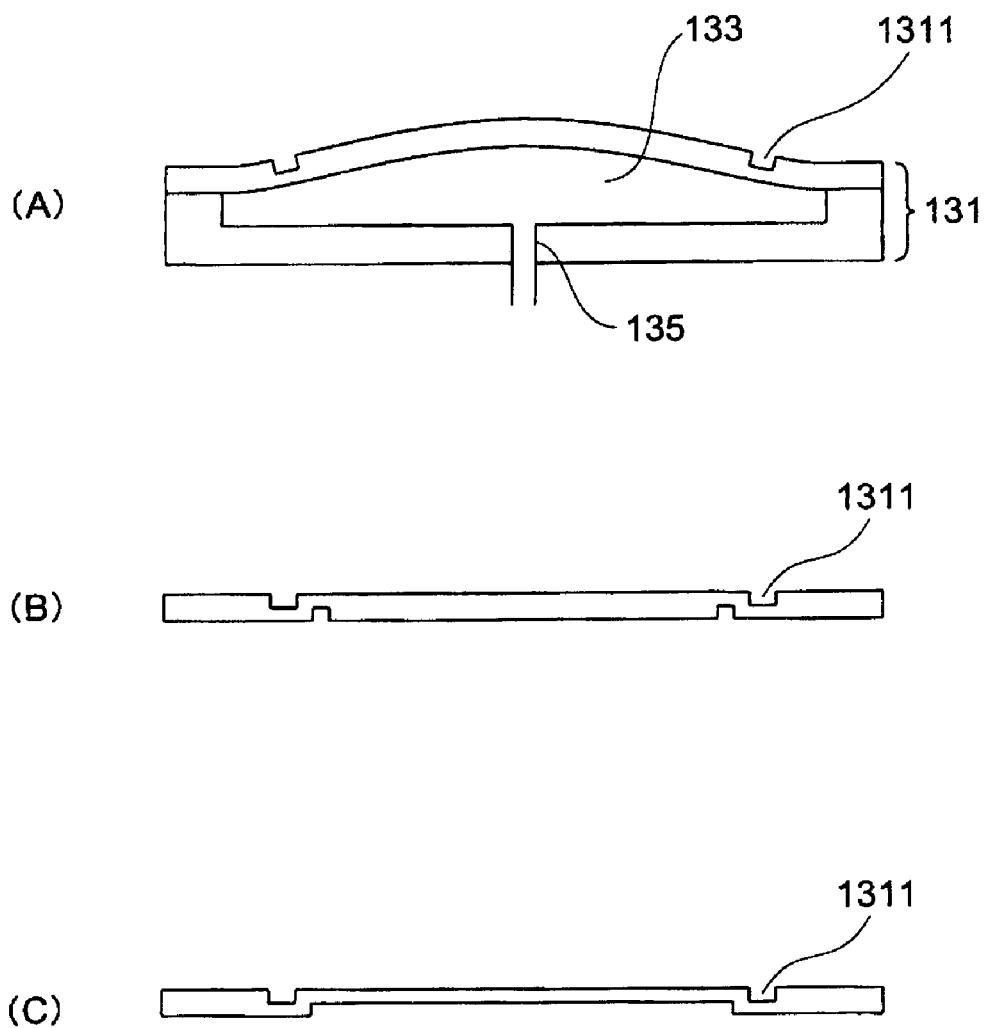
FIG. 9 is a view conceptually showing a shape of a pressure profile control module.

FIG. 9(A) is a view conceptually showing a shape of a pressure profile control module 131. For the sake of convenience, the lower plate is not shown. The air piping 135 is connected to the hollow portion 133, and the electro-pneumatic regulator (not shown) controls the pressure of the hollow portion 133. The central portion of the upper plate is displaced according to the pressure of the hollow portion 133. FIG. 9 shows a state in which the central portion of the upper plate is displaced such that the thickness of the hollow portion 133 is increased. As described above, for example, the hollow portion has thickness of 2 millimeters. For example, a deformation amount of the thickness of the hollow portion is 20 micrometers, for increase and decrease, respectively.

In a circumferential portion of an outer surface of the upper plate, a groove 1311 may be provided on a concentric circle having the center of the upper plate. For example, the groove has a width of 10 millimeters, and a depth of 6 millimeters. A concentrated load is avoided in the circumferential portion of the upper plate by the groove 1311 even if the center of the upper plate is displaced.

FIG. 9(B) is a view showing a variation of the upper plate, in which the grooves 1311 are provided on the concentric circle having the center of the upper plate in the circumferential portions of the outer and inner surfaces.

FIG. 9(C) is a view showing another variation of the upper plate, in which the groove 1311 is provided on the concentric circle having the center of the upper plate in the circumferential portion of the outer surface, and the thickness in a region closer to the center than the groove 1311 is thinner than that of the circumferential portion.

Figure 10:
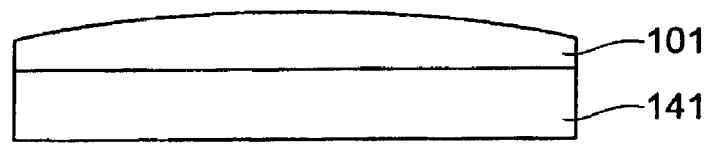
FIG. 10 is a view conceptually showing a shape of the heater unit in pressurized state.
Figure 10:
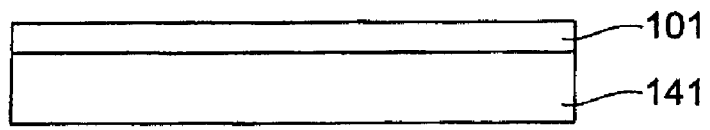
Figure 10:
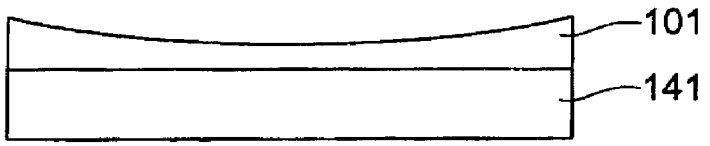

FIG. 10 is a view conceptually showing a shape of the heater unit 101 in pressurized state. It is assumed that F1 is a force generated by a pressure P1 of the hollow portion 133 of the pressure profile control module 131 and F2 is a force generated by a pressure P2 of the pressurizing unit 141. The electro-pneumatic regulator controls the pressure P1 of the hollow portion 133 of the pressure profile control module 131 and the pressure P2 of the pressurizing unit 141 in the range of, for example, −101 to 350 kPa.

As shown in FIG. 10(A), when the F1 is larger than the F2, the shape of the pressure profile control module 131 including the hollow portion 133 becomes convex, and the central portion in the surface of the top plate 111 becomes convex, thereby pressurizing the central portion of the workpiece.

As shown in FIG. 10(C), when the F2 is larger than the F1, the shape of the pressure profile control module 131 including the hollow portion 133 becomes concave, and the central portion in the surface of the top plate 111 becomes concave, thereby pressurizing the circumferential portion of the workpiece.

As shown in FIG. 10(B), when the F1 is equal to the F2, the shape of the pressure profile control module 131 including the hollow portion 133 becomes flat, and the surface of the top plate 111 becomes flat, thereby pressurizing the whole workpiece.

Other embodiments, in which a surface shape of the top plate 111 is changed, will be described below.

Figure 11:
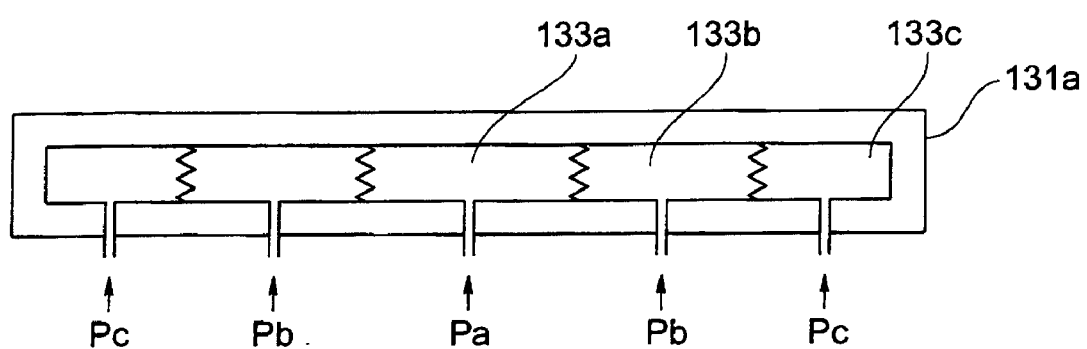
FIG. 11 is a conceptual view showing a configuration of a pressure profile control module according to another embodiment, in which a shape of a top plate surface is changed.

FIG. 11 is a conceptual view showing a configuration of a pressure profile control module 131$a$ of another embodiment, in which the surface shape of the top plate surface 111 is changed. The hollow portion 133 of the pressure profile control module is partitioned into several sections by a bellows or the like. For example, as shown in FIG. 11, the hollow portion 133 may be partitioned into a central portion 133$a$, an intermediate portion 133$b$, and a circumferential portion 133$c$. The piping is provided in each of the central portion 133$a$, the intermediate portion 133$b$, and the circumferential portion 133$c$ such that internal pressures Pa, Pb, and Pc can separately be controlled by the electro-pneumatic regulators. For example, the central portion of the pressure profile control module 131$a$ becomes convex by setting the pressure Pa of the central portion 133$a$ higher than the pressures Pb and Pc of the other portion. As a result, the central portion in the surface of the top plate 111 becomes convex.

Figure 12:
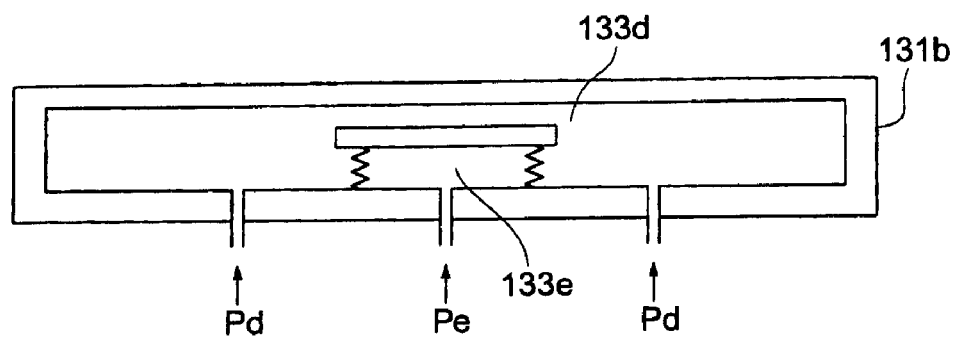
FIG. 12 is a conceptual view showing a configuration of a pressure profile control module according to still another embodiment, in which the shape of the top plate surface is changed.
Figure 12:
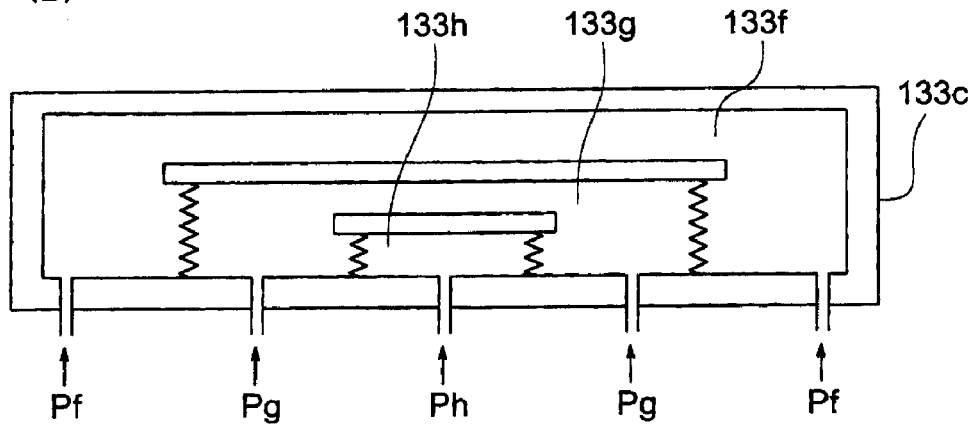

FIG. 12 is a conceptual view showing configurations of pressure profile control modules 131$b$ and 131$c$ according to still another embodiment, in which the surface shape of the top plate 111 is changed.

As shown in FIG. 12(A), a partitioned hollow portion 133$e$ is provided inside a hollow portion 133$d$ of a pressure profile control module 131$b$. The piping is provided in each of the hollow portion 133$d$ and the hollow portion 133$e$ such that the internal pressures can separately be controlled by the electro-pneumatic regulators. For example, the central portion of the pressure profile control module 131$b$ becomes convex by setting a pressure Pe of the partitioned hollow portion 133$e$ higher than a pressure Pd of the hollow portion 133$d$. As a result, the central portion in the surface of the top plate 111 becomes convex.

As shown in FIG. 12(B), a partitioned hollow portion 133$g$ is provided inside a hollow portion 133$f$ of a pressure profile control module 131$c$, and a partitioned hollow portion 133$h$ is further provided inside the hollow portion 133$g$. The piping is provided in each of the hollow portion 133$f$, hollow portion 133$g$, and the hollow portion 133$h$ such that the internal pressures can separately be controlled by the electro-pneumatic regulators. For example, a pressure Ph of the partitioned hollow portion 133$h$ is set higher than a pressure Pg of the hollow portion 133$g$, and the pressure Pg of the hollow portion 133$g$ is set higher than a pressure Pf of the hollow portion 133$f$, whereby the central portion of the pressure profile control module 131$c$ becomes convex. As a result, the central portion in the surface of the top plate 111 becomes convex.

In the embodiments shown in FIGS. 10 to 12, the surface shape of the top plate 111 is changed by changing the shape of the pressure profile control module 131. In order to transmit the change in shape of the pressure profile control module 131 to the surface shape of the top plate 111, the following configuration is preferable. That is, the heater unit placed between the top plate 111 and the pressure profile control module 131 is divided into plural heating modules 121, and each heating module 121 is supported through each heating module support member 125 through each heating module support member 125 by the pressure profile control module 131.

Figure 13:
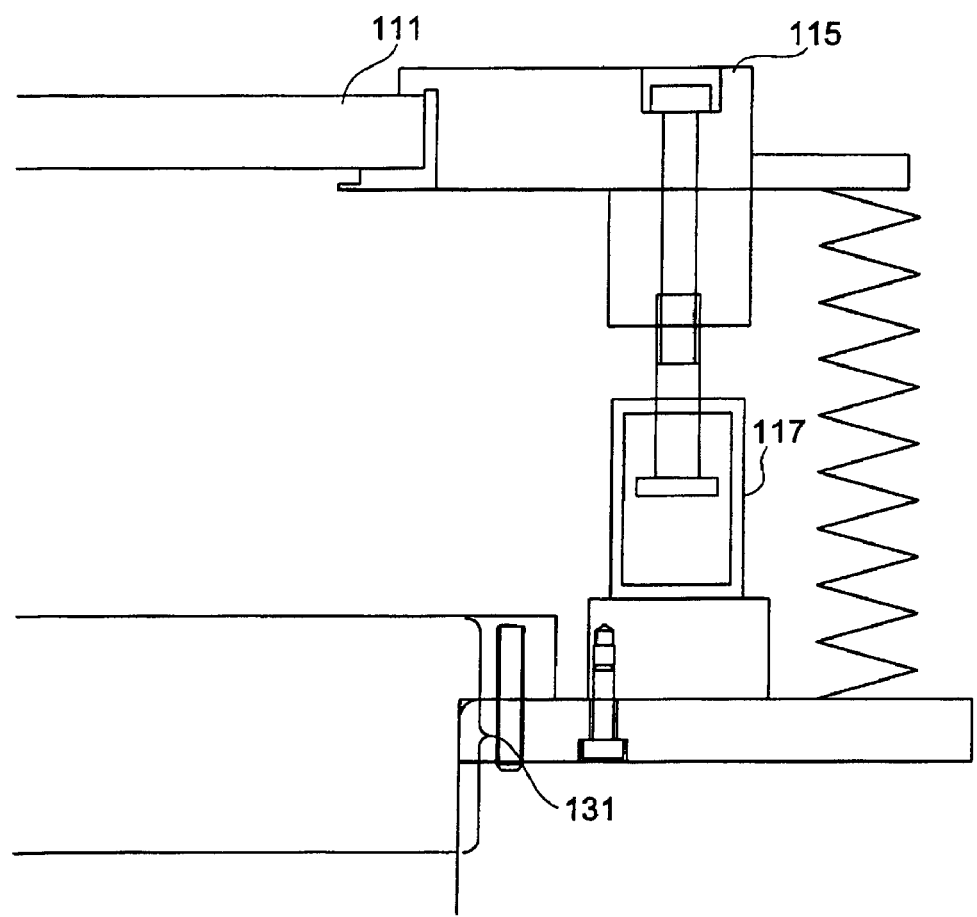
FIG. 13 is a view showing another embodiment in which the shape of the top plate surface is changed.

FIG. 13 is a view showing another embodiment in which the shape of the surface of the top plate 111 is changed. A pressurizing ring 115 is provided such that an outer circumference of the top plate 111 is fitted in the pressurizing ring 115, and the shape of the circumferential portion of the top plate 111 can be changed by downwardly pulling the pressurizing ring 115 using a cylinder 117.

According to an embodiment of the invention, in order to improve the flatness of the wafer bonding interface, the surface shape of the top plate can be changed through the heating module by changing the surface shape of the pressure profile control module. A variation in wafer thickness is transmitted from the top plate to the pressure profile control module through the heating module, and the pressure of the pressure profile control module is controlled, which allows the variation in wafer thickness to be absorbed.

According to an embodiment of the invention, the shape of the pressure profile control module is changed by appropriately controlling the pressure and pressurizing force of the hollow portion of the pressure profile control module, so that the surface shape of the top plate can be changed through the heating module. A variation in wafer thickness is transmitted from the top plate to the pressure profile control module through the heating module, and the pressure of the hollow portion of the pressure profile control module is appropriately controlled, which allows the variation in wafer thickness to be absorbed.

The invention claimed is:

1. A wafer bonding apparatus for bonding a plurality of wafers, comprising:
    an upper heater unit and a lower heater unit for heating the plurality of wafers, the plurality of wafers to be bonded being disposed between the upper heat unit and the lower heater unit;
    a top plate disposed on a surface of the lower heater unit; and
    a pressure profile control module;
    wherein the lower heater unit is disposed between the top plate and the pressure profile control module,
    wherein the plurality of wafers are bonded while pressurized and heated by the upper heater unit and the lower heater unit, and
    wherein a change in shape generated in a surface of the pressure profile control module is brought to a surface of the top plate.

2. The wafer bonding apparatus according to claim 1, wherein a hollow portion is configured to be provided in the pressure profile control module such that a pressure in the hollow portion can be controlled, and a variation in wafer thickness is absorbed to improve flatness of a bonding interface.

3. The wafer bonding apparatus according to claim 1, wherein the lower heater unit includes a plurality of heating modules.

4. The wafer bonding apparatus according to claim 3, wherein the plurality of heating modules are divided into a plurality of groups, and temperature control is performed in each of the groups.

5. The wafer bonding apparatus according to claim 3, wherein a heating module support member is provided between each of the plurality of heating modules and the pressure profile control module.

6. The wafer bonding apparatus according to claim 3, wherein the plurality of heating modules is attached to a surface of the top plate using a reamer bolt and a spring, the surface being located opposite to a surface facing the wafer.

7. The wafer bonding apparatus according to claim 2, wherein a pressure pressurized by the pressurizing unit and a pressure in the hollow portion are separately controlled, such that a surface shape of the top plate can be changed.

8. The wafer bonding apparatus according to claim 2, wherein the hollow portion is divided into plurality of zones and an internal pressure can be controlled in each zone, such that a surface shape of the top plate can be changed.

9. The wafer bonding apparatus according to claim 2, wherein a pressure chamber is provided inside the hollow portion and an internal pressure of the pressure chamber and an internal pressure of the hollow portion outside the pressure chamber can be separately controlled, such that a surface shape of the top plate can be changed.

10. The wafer bonding apparatus according to claim 1, wherein a ring is provided in a circumferential portion of the top plate, a cylinder is connected to the ring, and a shape of the circumferential portion of the top plate can be controlled by manipulating the cylinder.

11. The wafer bonding apparatus according to claim 1, wherein the lower heater unit includes cooling piping.

12. A wafer bonding method for bonding wafers using the wafer bonding apparatus as in claim 1, the method comprising:
disposing wafers to be bonded between a top plate of an upper unit and a top plate of a lower unit;
heating the top plates to a predetermined temperature;
pressuring the wafers to be bonded by the top plates; and
maintaining the wafers to be bonded for a predetermined time while the wafers are pressurized and heated.

13. The wafer bonding method according to claim 12, wherein a pressure applied to the wafers to be bonded by the top plates is released and the top plates are cooled after the wafers to be bonded are maintained for the predetermined time in the state that the wafers are pressurized and heated.

* * * * *